(12) United States Patent
Morita et al.

(10) Patent No.: US 7,638,806 B2
(45) Date of Patent: Dec. 29, 2009

(54) THIN-FILM SEMICONDUCTOR DEVICE, DISPLAY, AND METHOD FOR MANUFACTURING THIN FILM SEMICONDUCTOR DEVICE

(75) Inventors: Hiroaki Morita, Aichi (JP); Tomohiro Shiotani, Kanagawa (JP); Shinji Kubota, Aichi (JP); Kaoru Abe, Kanagawa (JP)

(73) Assignee: Sony Corporation, Tokyo (JP)

( * ) Notice: Subject to any disclaimer, the term of this patent is extended or adjusted under 35 U.S.C. 154(b) by 106 days.

(21) Appl. No.: 11/857,588

(22) Filed: Sep. 19, 2007

(65) Prior Publication Data

US 2008/0079007 A1   Apr. 3, 2008

(30) Foreign Application Priority Data

Sep. 29, 2006   (JP)   ............................. 2006-266301

(51) Int. Cl.
*H01L 29/04* (2006.01)

(52) U.S. Cl. .................... 257/72; 257/59; 257/E21.09; 257/E29.003; 257/347; 438/486; 438/458

(58) Field of Classification Search ............... 257/72, 257/59, 347, 350
See application file for complete search history.

(56) References Cited

U.S. PATENT DOCUMENTS

| 5,885,858 A | * | 3/1999 | Nishimura et al. | .......... 438/149 |
| 2004/0016924 A1 | * | 1/2004 | Yamada et al. | ................. 257/59 |

FOREIGN PATENT DOCUMENTS

| JP | 11-111989 | 4/1999 |
| JP | 2001-125142 | 5/2001 |
| JP | 2004-007004 | 1/2004 |

* cited by examiner

*Primary Examiner*—N Drew Richards
*Assistant Examiner*—Mamadou Diallo
(74) *Attorney, Agent, or Firm*—Sonnenschein Nath & Rosenthal LLP

(57) ABSTRACT

The present invention is to provide a thin film semiconductor device including a semiconductor thin film and an interlayer insulating film configured to cover the semiconductor thin film. In the interlayer insulating film, a hydrogen supply part and a blocking part against contamination are deposited in that order from a semiconductor thin film side.

15 Claims, 3 Drawing Sheets

THIN-FILM SEMICONDUCTOR DEVICE, DISPLAY, AND METHOD FOR MANUFACTURING THIN FILM SEMICONDUCTOR DEVICE

CROSS REFERENCES TO RELATED APPLICATIONS

The present invention contains subject matter related to Japanese Patent Application JP 2006-266301 filed in the Japan Patent Office on Sep. 29, 2006, the entire contents of which being incorporated herein by reference.

BACKGROUND OF THE INVENTION

1. Field of the Invention

The present invention relates to a thin film semiconductor device, display, and method for manufacturing a thin film semiconductor device, and particularly to a thin film semiconductor device preferably used as a thin film transistor that employs a polycrystalline silicon film arising from crystallization by laser annealing, display employing the same, and method for manufacturing a thin film semiconductor device.

2. Description of the Related Art

In a flat-panel display such as a liquid crystal display and organic EL display, thin film transistors (TFTs) are provided as elements for driving pixel electrodes. Of the TFTs, a polycrystalline silicon TFT, in which a polycrystalline silicon film is used as a semiconductor thin film serving as an active region, has a higher carrier mobility compared with an amorphous silicon TFT, and is suitable as a switching element for a display that is necessary to have higher performance.

For manufacturing of the polycrystalline silicon TFTs, a low-temperature process has been being developed in order to realize formation of the polycrystalline silicon TFTs not over a quartz substrate but over a low-cost glass or plastic substrate. In this low-temperature process, a method of turning amorphous silicon deposited over a substrate into polycrystalline silicon by laser annealing is carried out.

However, a polycrystalline silicon film crystallized by laser annealing includes a large number of crystalline defects, and hence electrons moving in the film are easily trapped by the crystalline defects. Therefore, it is not preferable that a polycrystalline silicon film be used as it is for the active region of a thin film transistor. To address this, in some countermeasures, an insulating film containing a large amount of hydrogen ions is formed on a polycrystalline silicon film arising from polycrystallization by laser annealing, and the polycrystalline silicon film is subjected to annealing treatment under a nitrogen atmosphere together with the insulating film, to thereby bury the hydrogen ions in crystalline defects in the polycrystalline silicon film. As the insulating film containing a large amount of hydrogen ions, a silicon nitride film is generally known. However, it is known that transistor characteristics are deteriorated when this insulating film is deposited by using only a silicon nitride layer. Therefore, typically the insulating film is formed in such a way that the silicon nitride film is interposed between silicon oxide films (refer to e.g. Japanese Patent Laid-open No. 11-111989).

Furthermore, a configuration has also been proposed in which a polycrystalline silicon film is interposed between upper and lower silicon nitride films. In this configuration, hydrogen is supplied from one silicon nitride film to the polycrystalline silicon film, and the other silicon nitride film suppresses diffusion of coupled hydrogen (refer to e.g. Japanese Patent Laid-open No. 2001-125142).

As another problem, the polycrystalline silicon film crystallized by laser annealing is susceptible to the influence of contamination and so on because it includes a large number of crystalline defects, and thus element functions are deteriorated. To address this problem, a configuration has also been proposed in which silicon nitride films having a blocking function against mobile ions (contamination) are formed both over and under a TFT (refer to e.g. Japanese Patent Laid-open No. 2004-7004).

SUMMARY OF THE INVENTION

However, the film quality is different between the above-described silicon nitride film serving as a hydrogen ion supply source and the silicon nitride film having a blocking function against contamination. The silicon nitride film containing a large amount of hydrogen ions includes a large number of film defects. As shown in FIG. 5A, in a structure in which a silicon nitride film 103 containing a large amount of hydrogen and a silicon oxide film 104 are provided over a polycrystalline silicon film 101 with the intermediary of a silicon oxide film 102, the film quality of the polycrystalline silicon film 101 is improved through hydrogen supply from the silicon nitride film 103 to the polycrystalline silicon film 101. However, this silicon nitride film 103 includes a large number of film defects and thus contamination (mobile ion) "a" is easily trapped by the film defects. As a result, part of the silicon nitride film 103 will have a fixed charge because the trapped contamination "a" behaves as the base point. This fixed charge makes transistor characteristics of the TFT unstable.

Furthermore, as shown in FIG. 5B, this silicon nitride film 103 is inferior in the function to block contamination because it involves a large number of film defects. Therefore, the contamination "a" passes through the silicon nitride film 103 toward the polycrystalline silicon film 101, which makes it difficult to prevent the deterioration of element functions.

On the other hand, in the silicon nitride film having a high blocking function against contamination, the amount of hydrogen is small. Therefore, when such a silicon nitride film is provided, it is difficult to bury hydrogen in crystalline defects in a polycrystalline silicon film although the occurrence of problems due to the contamination "a" is prevented.

It is desirable to provide a thin film semiconductor device and display having excellent characteristics stably by covering a polycrystalline silicon film with an interlayer insulating film that has a high blocking function against contamination and can repair defects in the polycrystalline silicon film through hydrogen supply. Furthermore, there is another need for the invention to provide a method for manufacturing this thin film semiconductor device.

According to an embodiment of the present invention, a thin film semiconductor device includes a semiconductor thin film and an interlayer insulating film configured to cover the semiconductor thin film. In this interlayer insulating film, a hydrogen supply part and a blocking part against contamination are deposited in that order from the semiconductor thin film side.

According to an embodiment of the present invention, a display includes a thin film semiconductor element configured to include a semiconductor thin film and an interlayer insulating film that covers the semiconductor thin film, and a display element configured to be driven by the semiconductor element. In this display, the structure of the interlayer insulating film is the same as the above-described structure.

In the thin film semiconductor device and display including the interlayer insulating film with such a structure, the hydrogen supply part and the blocking part are provided in the interlayer insulating film separately from each other. Therefore, each part is allowed to have a film quality that can offer the desired function sufficiently. Specifically, the hydrogen supply part, which is closer to the semiconductor thin film, can be formed to contain a large amount of hydrogen. Thus, by supply of a sufficient amount of hydrogen from this hydrogen supply part, crystalline defects in the semiconductor thin film are filled sufficiently. On the other hand, the blocking part, which is provided outside the hydrogen supply part from the viewpoint of the semiconductor thin film, can be formed as a dense film having a high blocking function against contamination. This prevents contamination from entering the hydrogen supply part and the semiconductor thin film side with high probability.

According to an embodiment of the present invention, there is provided a method for manufacturing a thin film semiconductor device. The method includes the steps of forming a semiconductor thin film and depositing an interlayer insulating film that covers the semiconductor thin film. In the step of depositing an interlayer insulating film, the condition is so changed in the middle of the film deposition that a hydrogen supply part and a blocking part are deposited sequentially from the semiconductor thin film side.

As described above, according to the embodiments of the present invention, an interlayer insulating film has a structure in which a hydrogen supply part and a blocking part are provided separately from each other. Thus, the interlayer insulating film has a high blocking function against contamination and can sufficiently repair defects in a semiconductor thin film through hydrogen supply. As a result, characteristics of a thin film semiconductor device employing this semiconductor thin film can be stably enhanced. Furthermore, in a display that includes display elements driven by thin film semiconductor elements employing this semiconductor thin film, characteristics of the display elements can be stably enhanced and thus the displaying characteristic can be enhanced.

DETAILED DESCRIPTION OF THE PREFERRED EMBODIMENTS

Embodiments of the present invention will be described in detail below based on the drawings.

First Embodiment

Figure 1:
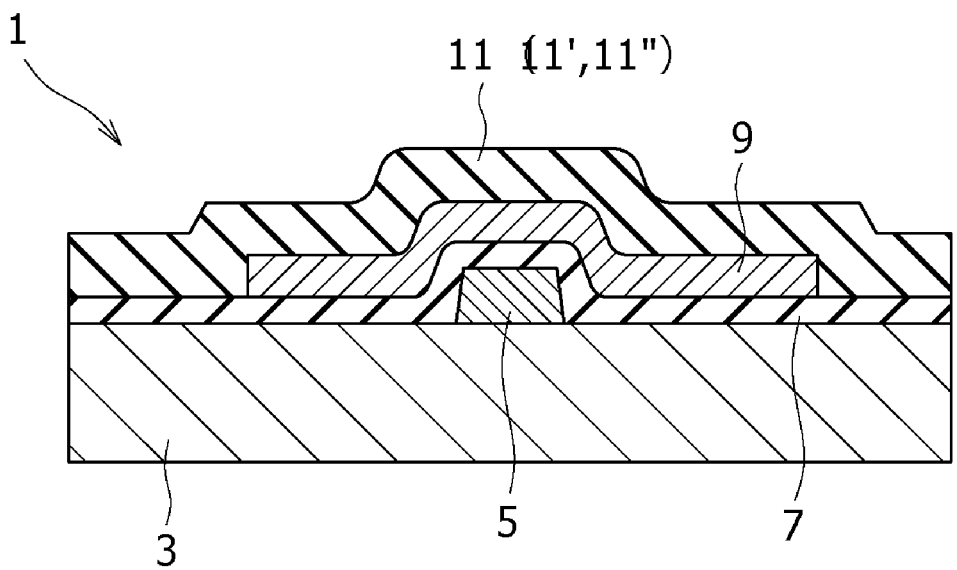
FIG. 1 is a sectional view showing the schematic structure of a thin film semiconductor device according to an embodiment of the present invention.

As shown in FIG. 1, a thin film semiconductor device 1 of a first embodiment of the present invention is formed as a bottom-gate thin film transistor. This thin film semiconductor device 1 includes a gate electrode 5 pattern-formed on a substrate 3, a gate insulating film 7 covering the gate electrode 5, a semiconductor thin film 9 pattern-formed on the gate insulating film 7 to overlap with the gate electrode 5, and an interlayer insulating film 11 covering the semiconductor thin film 9.

The semiconductor thin film 9 is formed of a polycrystalline silicon film arising from crystallization annealing treatment by laser irradiation, and therefore includes crystalline defects. This semiconductor thin film 9 includes a channel part disposed over the gate electrode 5 and source/drain doped with impurities and disposed on both the sides of the channel part. The semiconductor thin film 9 may have a structure in which the channel part and source/drain that are formed in different layers are stacked on each other. In this case, at least the part of the semiconductor thin film serving as the channel part is formed of a polycrystalline silicon film arising from crystallization annealing treatment by laser irradiation.

The first embodiment is characterized by the structure of the interlayer insulating film 11 covering such a semiconductor thin film (polycrystalline silicon film) 9.

Figure 2:
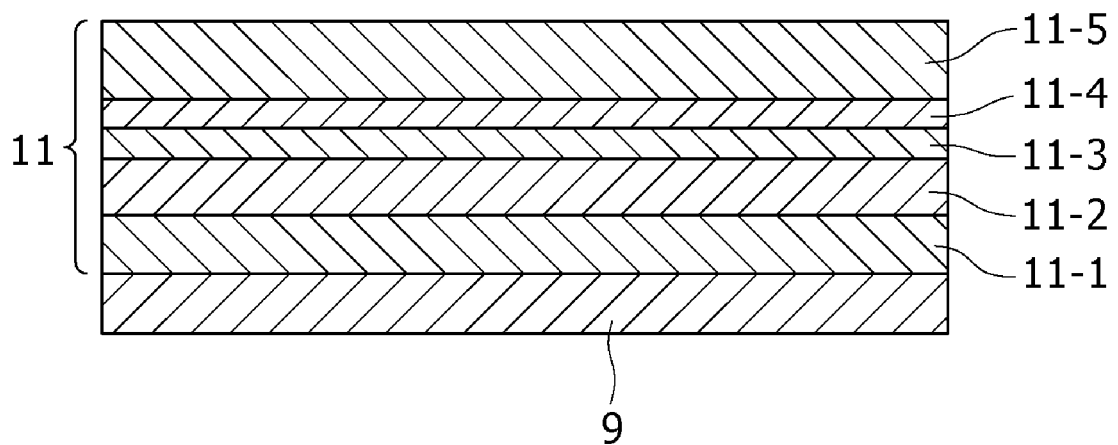
FIG. 2 is a sectional view showing a characteristic part of a thin film semiconductor device according to a first embodiment of the present invention.

Specifically, as shown in FIG. 2, the interlayer insulating film 11 has a five-layer structure obtained by sequentially depositing a lower silicon oxide film 11-1, a hydrogen-containing silicon nitride film 11-2, a middle silicon oxide film 11-3, a blocking silicon nitride film 11-4, and an upper silicon oxide film 11-5 in that order from the semiconductor thin film side. In particular, the interlayer insulating film 11 is characterized in that the hydrogen-containing silicon nitride film 11-2 serving as a hydrogen supply part and the blocking silicon nitride film 11-4 serving as a blocking part are so provided as to have the different functions separately.

The hydrogen-containing silicon nitride film 11-2 is aimed only at hydrogen supply to the semiconductor thin film (polycrystalline silicon film) 9, and is formed as a hydrogen supply part in the interlayer insulating film 11. Therefore, it is enough for the hydrogen-containing silicon nitride film 11-2 to contain a sufficient amount of hydrogen, and it does not need to be dense. The hydrogen-containing silicon nitride film 11-2 having such a film quality is deposited by CVD in which the deposition pressure is set high or the deposition temperature is set low. Furthermore, also by using a low flow rate as the flow rate of a dilution gas (e.g., argon or hydrogen) added to the deposition gas (e.g., silane or ammonia) in the CVD deposition, the hydrogen-containing silicon nitride film 11-2 containing a large amount of hydrogen is obtained.

The blocking silicon nitride film 11-4 is aimed only at trapping contamination (mobile ion) and preventing the passage of contamination, and is formed as a blocking part against contamination (mobile ion) in the interlayer insulating film 11. Therefore, it is enough for the blocking silicon nitride film 11-4 to be dense, and it does not need to contain hydrogen. The blocking silicon nitride film 11-4 having such a film quality is deposited by CVD in which the deposition pressure is set low or the deposition temperature is set high. Furthermore, also by using a high flow rate as the flow rate of a dilution gas (e.g., argon or hydrogen) added to the deposition gas (e.g., silane or ammonia) in the CVD deposition, the blocking silicon nitride film 11-4 as a dense film is obtained.

The structure of each of the silicon nitride films 11-2 and 11-4 is not limited to a single-layer structure, but each film may have a multi-layer structure formed of layers or parts having different film qualities. The important points of these films are that the whole of the hydrogen-containing silicon nitride film 11-2 contains a sufficient and larger amount of hydrogen than that of the whole of the blocking silicon nitride film 11-4, and that the whole of the blocking silicon nitride film 11-4 is denser than the whole of the hydrogen-containing silicon nitride film 11-2 and has a favorable blocking function against contamination (mobile ion).

The film qualities of the hydrogen-containing silicon nitride film 11-2 and the blocking silicon nitride film 11-4 are checked through measurement of their etching rates (speeds) in wet etching in which e.g. a hydrofluoric acid solution is employed as the etching solution. Specifically, the etching rate of a silicon nitride film becomes higher as the hydrogen content in the film becomes larger, while the etching rate becomes lower as the film becomes denser. Therefore, it is preferable that the film qualities of the hydrogen-containing silicon nitride film 11-2 and the blocking silicon nitride film 11-4 be designed in consideration of processing of the interlayer insulating film 11, such as formation of connection holes therein. For example, it is preferable to prevent increase in the time it takes for the interlayer insulating film 11 to be processed, by designing the film qualities of the hydrogen-containing silicon nitride film 11-2 and the blocking silicon nitride film 11-4 in such a way that the ratio of the etching rate of the blocking silicon nitride film 11-4 to that of the hydrogen-containing silicon nitride film 11-2 will be in the range of about 1/5 to 1/20.

The lower silicon oxide film 11-1, the middle silicon oxide film 11-3, and the upper silicon oxide film 11-5 are configured to have the respective desired film thicknesses. For example, the lower silicon oxide film 11-1 is formed to have a film thickness that permits prevention of the deterioration of transistor characteristics due to the contact of the hydrogen-containing silicon nitride film 11-2 with the semiconductor thin film 9. Furthermore, because the upper silicon oxide film 11-5 is used to planarize the surface of the interlayer insulating film 11 in some cases, it is formed to have a film thickness sufficient for the planarization.

The structure of each of the lower silicon oxide film 11-1, the middle silicon oxide film 11-3, and the upper silicon oxide film 11-5 is also not limited to a single-layer structure, but each film may have a multi-layer structure formed of layers or parts having different film qualities. For example, the upper silicon oxide film 11-5, which is the uppermost layer, may have a multi-layer structure formed of a layer having a uniform film thickness and a layer suitable for filling of steps.

The thin film semiconductor device 1 including the interlayer insulating film 11 with the above-described structure is used as e.g. a thin film semiconductor element for driving a display element in a display. In this case, plural thin film semiconductor elements (thin film semiconductor devices 1) are formed and arranged over the substrate 3, and signal lines and pixel electrodes connected to the respective thin film semiconductor elements 1 are provided on the interlayer insulating film 11. It is preferable that the upper silicon oxide film 11-5, which is the uppermost layer in the interlayer insulating film 11, have a structure resulting from surface planarization treatment.

In manufacturing of the thin film semiconductor device 1 having the above-described configuration, the deposition condition is sequentially changed on a layer basis in the step of depositing the interlayer insulating film 11, to thereby obtain the interlayer insulating film 11 having the above-described multi-layer structure. In this film deposition, in the CVD for the blocking silicon nitride film 11-4 in particular, the deposition pressure is set lower or the deposition temperature is set higher, or more alternatively the flow rate of a dilution gas (e.g., argon or hydrogen) added to the deposition gas (e.g., silane or ammonia) in the CVD deposition is set higher, compared with the deposition condition of the CVD for the hydrogen-containing silicon nitride film 11-2. After the formation of the interlayer insulating film 11, annealing treatment is carried out to supply the hydrogen in the hydrogen-containing silicon nitride film 11-2 to the semiconductor thin film 9 and promote termination in the film 9.

As one example, the deposition of the hydrogen-containing silicon nitride film 11-2 and the blocking silicon nitride film 11-4 is carried out under the condition shown in Table 1 or 2.

TABLE 1

| Deposition condition | Blocking silicon nitride film 11-4 | Hydrogen-containing silicon nitride film 11-2 |
|---|---|---|
| SiH4 flow rate (sccm) | 400 means | |
| NH3 (sccm) | 3000 | |
| RF power (W) | 3000 | |
| Deposition atmosphere pressure (Pa) | 150 | 250 |
| Deposition temperature (° C.) | 350 | |

TABLE 2

| Deposition condition | Blocking silicon nitride film 11-4 | Hydrogen-containing silicon nitride film 11-2 |
|---|---|---|
| SiH4 flow rate (sccm) | 400 | |
| NH3 (sccm) | 3000 | |
| RF power (W) | 3000 | |
| Deposition atmosphere pressure (Pa) | 250 | |
| Deposition temperature (° C.) | 400 | 350 |

In the above-described first embodiment, in the interlayer insulating film 11 covering the semiconductor thin film (polycrystalline silicon film) 9, the hydrogen-containing silicon nitride film 11-2 serving as a hydrogen supply part and the blocking silicon nitride film 11-4 serving as a contamination blocking part are so provided as to have the different functions separately. Therefore, each part is allowed to have a film quality that can offer the desired function sufficiently.

Specifically, the hydrogen-containing silicon nitride film 11-2, which is closer to the semiconductor thin film (polycrystalline silicon film) 9, can be formed to contain a large amount of hydrogen. Thus, the large amount of hydrogen generated from the hydrogen-containing silicon nitride film 11-2 is supplied to the semiconductor thin film (polycrystalline silicon film) 9 sufficiently, which allows the hydrogen to be buried in crystalline defects in the semiconductor thin film 9 sufficiently. Specifically, hydrogen ions are coupled to silicon dangling bonds existing at the crystalline defect parts, so that the dangling bonds are terminated. This prevents carriers from being trapped by the crystalline defects (dangling bonds), which can enhance the carrier mobility in the semiconductor thin film (polycrystalline silicon film) 9.

Figure 3A:
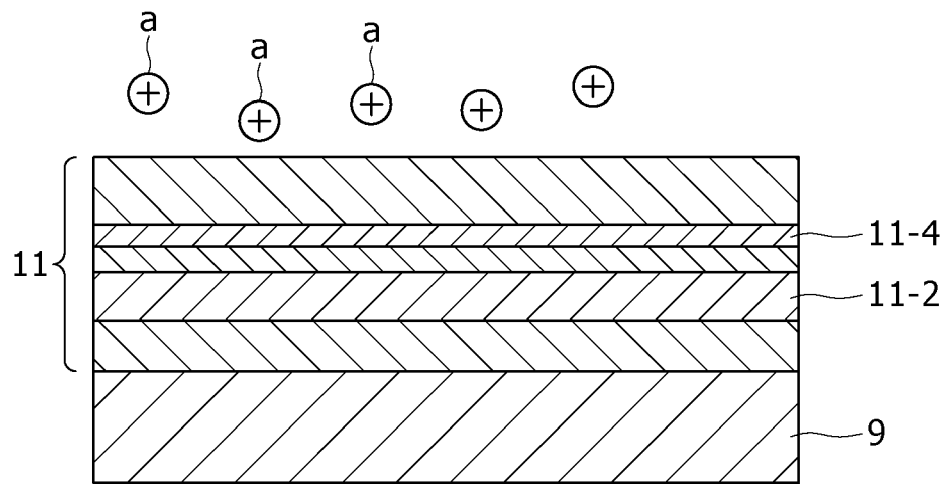
FIGS. 3A to 3C are sectional views for explaining an advantageous effect of the thin film semiconductor device according to the first embodiment.
Figure 3B:
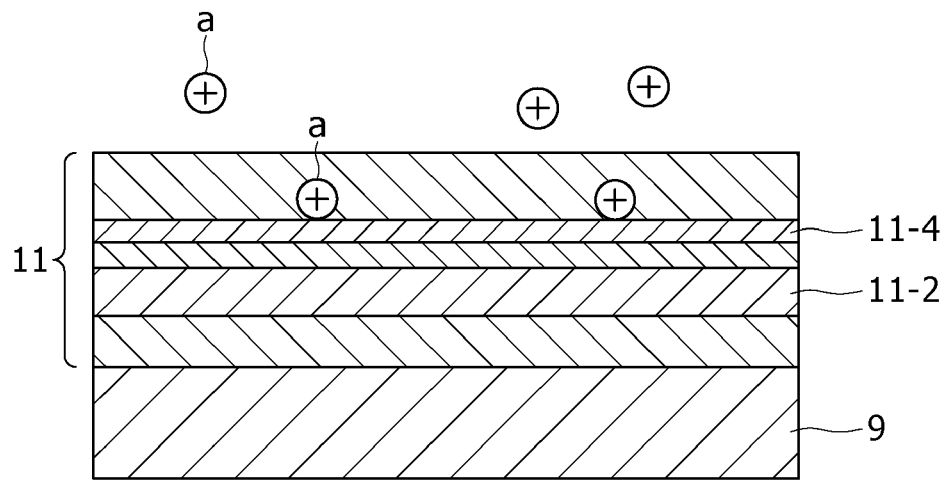

Furthermore, the blocking silicon nitride film 11-4, which is provided outside the hydrogen-containing silicon nitride film 11-2 from the viewpoint of the semiconductor thin film (polycrystalline silicon film) 9, can be formed as a dense film having a high blocking function against contamination. Therefore, even when the contamination "a" exists outside the interlayer insulating film 11 as shown in FIG. 3A, the contamination "a" is blocked at the surface of the blocking silicon nitride film 11-4 formed as a dense film. Thus, as shown in FIG. 3B, it is possible to prevent, with high probability, the contamination "a" from entering the hydrogen-containing silicon nitride film 11-2 and the semiconductor thin film (polycrystalline silicon film) 9 inside the blocking silicon nitride film 11-4. This prevents the unstable deterioration of element characteristics due to the arrival of the contamination "a" at the semiconductor thin film (polycrystalline silicon film) 9.

In addition, it is also possible to prevent the contamination "a" from being trapped by the blocking silicon nitride film 11-4 itself, formed as a dense film. Therefore, the interlayer insulating film 11 can be prevented from being partially turned into a fixed charge layer. Thus, in-plane distribution (variation) of element characteristics is prevented.

Figure 3C:
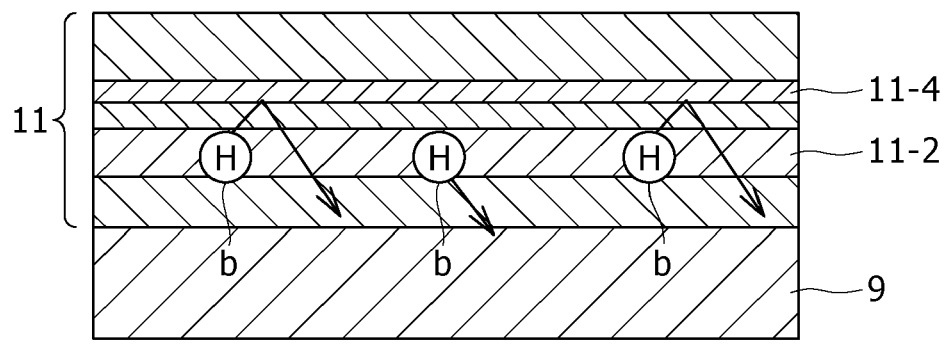

Furthermore, as shown in FIG. 3C, hydrogen generated from the hydrogen-containing silicon nitride film 11-2 is blocked by the blocking silicon nitride film 11-4 so as to be prevented from being discharged to the outside. This also offers an advantage that the hydrogen generated from the hydrogen-containing silicon nitride film 11-2 can be efficiently supplied to the semiconductor thin film (polycrystalline silicon film) 9.

As a result of the above-described advantageous effects, the configuration of the first embodiment can stably enhance characteristics of the thin film semiconductor device (thin film transistor) 1 that employs the semiconductor thin film (polycrystalline silicon film) 9 arising from crystallization annealing treatment by laser irradiation. Furthermore, in a display in which the thin film semiconductor devices 1 employing this semiconductor thin film 9 are used as drive elements for display elements, characteristics of the display elements can be stably enhanced and thus the displaying characteristic can be enhanced.

Another advantage can also be achieved. Specifically, in an existing configuration in which only a silicon nitride film containing a large amount of hydrogen is provided in an interlayer insulating film, it is necessary that this silicon nitride film, which contains a large amount of hydrogen but is not dense, be provided to have a large film thickness in order to prevent contamination from entering a semiconductor thin film. In contrast, in a configuration like the first embodiment, in which the respective silicon nitride films 11-2 and 11-4 are so provided that the hydrogen supply function and the contamination blocking function are separately assigned to these films, the total film thickness of the silicon nitride films can be set smaller. This can shorten the times it takes for an interlayer insulating film to be deposited and processed.

Moreover, in the first embodiment in particular, the middle silicon oxide film 11-3 is interposed between the hydrogen-containing silicon nitride film 11-2 and the blocking silicon nitride film 11-4. This makes it possible to dispose the hydrogen-containing silicon nitride film 11-2 close to the semiconductor thin film (polycrystalline silicon film) 9 for efficient hydrogen supply, and dispose the surface of the blocking silicon nitride film 11-4, at which contamination possibly exists, at a position remote as much as possible from the semiconductor thin film (polycrystalline silicon film) 9 separately, while keeping small thicknesses of the silicon nitride films 11-2 and 11-4, which have a high dielectric constant.

Second Embodiment

Figure 4:
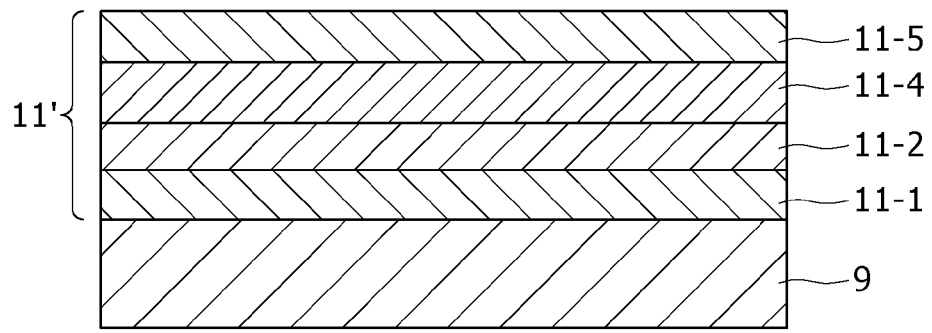
FIG. 4 is a sectional view showing a characteristic part of a thin film semiconductor device according to a second embodiment of the present invention.
Figure 5A:
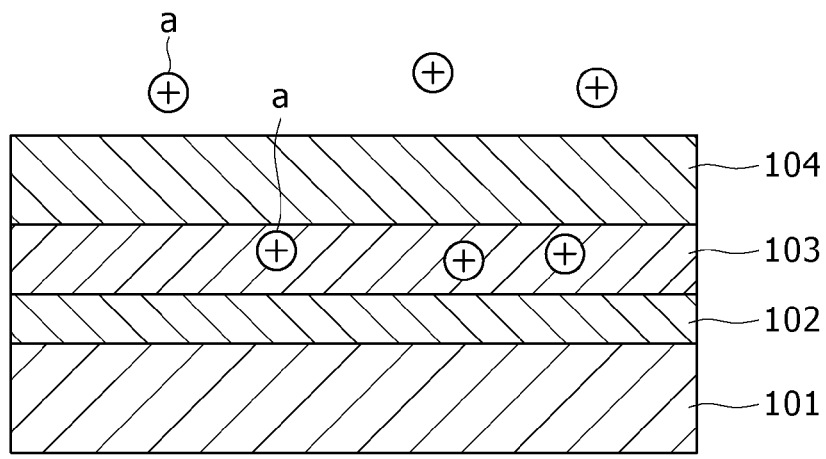
FIGS. 5A and 5B are sectional views for explaining a problem in a thin film semiconductor device having an existing structure.
Figure 5B:
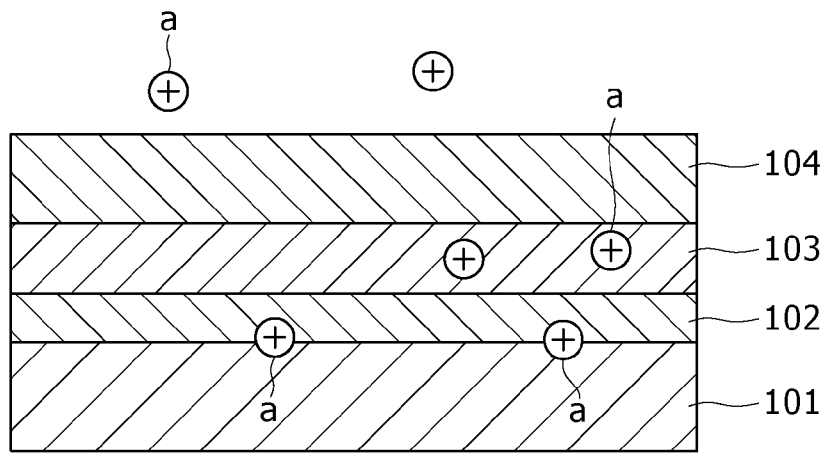

FIG. 4 is a sectional view showing a characteristic part of a second embodiment of the present invention. The second embodiment shown in FIG. 4 is different from the above-described first embodiment in the structure of an interlayer insulating film 11', and other configurations are the same as those of the first embodiment.

Specifically, the interlayer insulating film 11' of the second embodiment has a four-layer structure in which a blocking silicon nitride film 11-4 is deposited directly on a hydrogen-containing silicon nitride film 11-2. This four-layer structure is obtained by sequentially depositing a lower silicon oxide film 11-1, the hydrogen-containing silicon nitride film 11-2, the blocking silicon nitride film 11-4, and an upper silicon oxide film 11-5 in that order from the semiconductor thin film side.

The detailed structures of the respective films are the same as those of the first embodiment.

Similarly to the first embodiment, a thin film semiconductor device 1 including such an interlayer insulating film 11' is used as e.g. a thin film semiconductor element for driving a display element in a display. Moreover, similarly to the first embodiment, in manufacturing of the thin film semiconductor device 1 including the interlayer insulating film 11' with the above-described structure, the deposition condition is sequentially changed on a layer basis in the deposition of the interlayer insulating film 11', to thereby obtain the interlayer insulating film 11' having the above-described multi-layer structure. Thereafter, annealing treatment is carried out to supply hydrogen in the hydrogen-containing silicon nitride film 11-2 to the semiconductor thin film 9 and promote termination in the film 9.

The second embodiment also has a configuration in which in the interlayer insulating film 11' covering the semiconductor thin film (polycrystalline silicon film) 9, the hydrogen-containing silicon nitride film 11-2 serving as a hydrogen supply part and the blocking silicon nitride film 11-4 serving as a contamination blocking part are so provided as to have the different functions separately. Therefore, similarly to the first embodiment, the carrier mobility can be enhanced through supply of sufficient hydrogen to the semiconductor thin film (polycrystalline silicon film) 9. Furthermore, contamination "a" is prevented, with high probability, from entering the blocking silicon nitride film 11-4 and the hydrogen-containing silicon nitride film 11-2 and the semiconductor thin film (polycrystalline silicon film) 9 inside the blocking silicon nitride film 11-4, and thus the unstable deterioration and in-plane distribution (variation) of element characteristics can be prevented.

As a result, similarly to the first embodiment, it is possible to stably enhance characteristics of a thin film transistor that employs the semiconductor thin film (polycrystalline silicon film) 9 arising from crystallization annealing treatment by laser irradiation. Furthermore, in a display in which the thin film semiconductor devices 1 employing this semiconductor thin film 9 are used as drive elements for display elements, characteristics of the display elements can be stably enhanced and thus the displaying characteristic can be enhanced.

In addition, similarly to the first embodiment, it is also possible to shorten the times it takes for an interlayer insulating film to be deposited and processed.

When there is no need to take into consideration the deterioration of elements due to provision of a silicon nitride film directly on the semiconductor thin film 9 for example, the following configurations are available as modification examples of the second embodiment: a configuration in which a multi-layer structure of the hydrogen-containing silicon nitride film 11-2 and the blocking silicon nitride film 11-4 is provided directly on the semiconductor thin film 9; and a configuration including an interlayer insulating film formed only of the hydrogen-containing silicon nitride film 11-2 and the blocking silicon nitride film 11-4.

Such configurations can also offer the same advantages as the above-described advantages because in the interlayer insulating film 11' covering the semiconductor thin film (polycrystalline silicon film) 9, the hydrogen-containing silicon nitride film 11-2 serving as a hydrogen supply part and the blocking silicon nitride film 11-4 serving as a contamination blocking part are provided separately from each other.

The above-described first and second embodiments are applied to a bottom-gate thin film transistor. However, embodiments of the present invention can be widely applied to a thin film semiconductor device that includes a semiconductor thin film and an interlayer insulating film covering the semiconductor thin film. Therefore, embodiments of the present invention can be applied also to e.g. a top-gate thin film transistor, in which a gate electrode is pattern-formed over a semiconductor thin film with the intermediary of a gate insulating film and an interlayer insulating film is provided to cover them. Also in this case, the same advantages can be obtained by employing, as the structure of the interlayer insulating film, a structure in which a hydrogen supply part and a contamination blocking part are deposited in that order from the semiconductor thin film side.

If there is a fear of the entering of contamination "a" from the substrate 3, a configuration may be employed in which an interlayer insulating film obtained by depositing at least the blocking silicon nitride film 11-4 and the hydrogen-containing silicon nitride film 11-2 in that order is provided on the substrate 3 and a semiconductor thin film (thin film transistor) is provided over the interlayer insulating film. In this case, the interlayer insulating film has the reverse stacking order of the stacking order in the interlayer insulating films 11 and 11' in the first and second embodiments. The interlayer insulating films 11 and 11' may be provided both on and under a semiconductor thin film (thin film transistor) in such a manner as to sandwich it.

It should be understood by those skilled in the art that various modifications, combinations, sub-combinations and alternations may occur depending on design requirements and other factors insofar as they are within the scope of the appended claims or the equivalent thereof.

What is claimed is:

1. A thin film semiconductor device comprising:
   a semiconductor thin film; and
   an interlayer insulating film configured to cover the semiconductor thin film, wherein,
      in the interlayer insulating film, a hydrogen supply part and a blocking part against contamination are deposited in that order from a semiconductor thin film side, and
      the hydrogen supply part is provided in direct contact with the semiconductor thin film.

2. The thin film semiconductor device according to claim 1, wherein the hydrogen supply part and the blocking part are each formed of a silicon nitride film.

3. The thin film semiconductor device according to claim 1, wherein the hydrogen supply part contains more hydrogen than the blocking part, and the blocking part is denser than the hydrogen supply part.

4. The thin film semiconductor device according to claim 1, further comprising:
   a silicon oxide film interposed between the hydrogen supply part and the blocking part.

5. The thin film semiconductor device according to claim 1, wherein the semiconductor thin film is formed of a polycrystalline silicon film arising from crystallization annealing treatment by laser irradiation.

6. A display comprising: a thin film semiconductor element configured to include a semiconductor thin film and an interlayer insulating film that covers the semiconductor thin film; and a display element configured to be driven by the semiconductor element, wherein in the interlayer insulating film, a hydrogen supply part and a blocking part against contamination are deposited in that order from a semiconductor thin film side and the hydrogen supply part is provided in direct contact with the semiconductor thin film.

7. A method for manufacturing a thin film semiconductor device, the method comprising the steps of: forming a semiconductor thin film; and depositing an interlayer insulating film that covers the semiconductor thin film, wherein in the depositing an interlayer insulating film, a condition is so changed in the middle of film deposition that a hydrogen supply part and a blocking part against contamination are deposited sequentially from a semiconductor thin film side, and the hydrogen supply part is provided in direct contact with the semiconductor thin film.

8. The display according to claim 6, wherein the hydrogen supply part and the blocking part are each formed of a silicon nitride film.

9. The display according to claim 6, wherein the hydrogen supply part contains more hydrogen than the blocking part, and the blocking part is denser than the hydrogen supply part.

10. The display according to claim 6, further comprising:
    a silicon oxide film interposed between the hydrogen supply part and the blocking part.

11. The display according to claim 6, wherein the semiconductor thin film is formed of a polycrystalline silicon film arising from crystallization annealing treatment by laser irradiation.

12. The method according to claim 7, wherein the hydrogen supply part and the blocking part are each formed of a silicon nitride film.

13. The method according to claim 7, wherein the hydrogen supply part contains more hydrogen than the blocking part, and the blocking part is denser than the hydrogen supply part.

14. The method according to claim 7, further comprising:
    interposing a silicon oxide film between the hydrogen supply part and the blocking part.

15. The method according to claim 7, wherein the semiconductor thin film is formed of a polycrystalline silicon film arising from crystallization annealing treatment by laser irradiation.

* * * * *